United States Patent [19]

Sauer

[11] Patent Number: 4,523,156

[45] Date of Patent: Jun. 11, 1985

[54] ANTI-DISTORTION ANTI-TRANSIENT TONE CONTROL CIRCUIT

[75] Inventor: Don R. Sauer, San Jose, Calif.

[73] Assignee: National Semiconductor Corporation, Santa Clara, Calif.

[21] Appl. No.: 517,185

[22] Filed: Jul. 25, 1983

[51] Int. Cl.$^3$ ............................................... H03G 9/16
[52] U.S. Cl. ..................................... 330/282; 330/86; 330/149; 333/28 T
[58] Field of Search .......................... 330/86, 282, 149; 333/28 T; 381/101, 102

[56] References Cited

U.S. PATENT DOCUMENTS 3,500,316  3/1970  Brown ............................. 330/282 X
4,179,669 12/1979  Dodson et al. ....................... 330/282

Primary Examiner—James B. Mullins
Attorney, Agent, or Firm—Gail W. Woodward; Paul J. Winters; Michael J. Pollock

[57] ABSTRACT

A tone control circuit including an amplifier having a continuously adjustable frequency response control for varying the effect of low and high frequency filters upon the amplifier, and incorporating a novel distortion and transient suppression circuit is disclosed. A programmable variable resistance is coupled between an input and an output of said amplifier to attenuate circuit low frequency response while initially varying resistor value in response to a programming distortion/transient control signal. Thereafter, overall amplifier gain is further varied in response to the programming distortion/-transient control signal by further adjusting the variable resistor value. Various embodiments of the invention provide both continuous and discrete control of tone and volume responsive to both excessive low frequency signal and transients. The present invention is implemented in both discrete and monolithic embodiments, which include both linear and CMOS technologies.

12 Claims, 4 Drawing Figures

ANTI-DISTORTION ANTI-TRANSIENT TONE CONTROL CIRCUIT

BACKGROUND OF THE INVENTION

1. Field of the Invention

The present invention relates to the control of tone in an audio circuit. More particularly, the present invention relates to a circuit for controlling tone in an audio amplifier to prevent distortion due to clipping and to prevent reproduction of transient signals introduced by power or input switching.

2. Description of the Prior Art

Circuits for controlling tone in an audio amplifier are well known. Such a circuit is shown schematically in FIG. 1. The tone control circuit shown works on the principle that at low frequencies capacitors C1 and C2 appear as open circuits. Potentiometer R1 defines circuit gain at low frequencies (bass). At approximately 1 kHz capacitors C1 and C2 are much lower in impedance than potentiometer R1 and higher in impedance than potentiometer R2. Capacitors C1 and C2 accordingly set circuit gain to unity at this frequency. At higher frequencies (treble) potentiometer R2 is much lower in impedance than both potentiometer R1 and capacitors C1 and C2 such that circuit gain is controlled by potentiometer R2.

In almost any audio system (such as that shown in FIG. 1) it is possible to increase the volume level or the bass (tone) controls so that the output signal at the speaker becomes very distorted-usually as the result of signal clipping. It has not been possible to provide the desired amount of control of amplifier dynamic range in both volume and tone without encountering this problem. It is possible to still allow for the desired head room and yet prevent clipping by detecting any clipping present in the audio signal at the power amplifier, and using the detected clipping signal to decrease the bass and volume levels.

In an audio reproduction system, it is far more likely that high peak signals that can produce clipping will be encountered in lower frequencies than at higher frequencies. Since the bass is very likely to contain such high level signals, it is desirable to decrease bass response before decreasing volume level. In this way, clipping due to excess energy in the bass region of the signal is prevented without effecting the overall dynamic range of the program material presented to the amplifier. If, after decreasing response at the bass frequencies the distortion still persists, then the overall volume level may be reduced to prevent such clipping or distortion.

A further type of interference is encountered when switching transients are produced by power switching or input source switching. Such transients produce a disagreeable loud pop which is reproduced by the system speakers. The conditions that produce such transients are well defined and it is a common practice to address this problem.

SUMMARY OF THE INVENTION

The present invention relates to initially reducing bass response and then overall signal level in an audio amplifier to prevent clipping and to attenuate power and switching transients. The invention provides an electronic variable resistor incorporated into a tone control circuit. The invention provides initial bass response control and, thereafter, volume level control when clipping or transient interference is detected.

Typical tone control circuits employ an operational amplifier or other such amplifier having a differential input. The amplifier's output is fed back to the negative input of the amplifier through a low frequency (bass) feedback network controlled by a high resistance potentiometer and through a high frequency (treble) feedback network controlled by a second, lower resistance potentiometer. Two capacitors filter low frequency signals from the signal flowing through the second potentiometer and define the gain of the tone control circuit as unity for midrange frequencies.

The electronically variable resistor in the present invention is coupled between the output of the amplifier and the amplifier's input. By varying the resistance in response to that sensed dynamic levels and transients, the circuit bass response is initially reduced. Thereafter, overall volume level is reduced to further prevent clipping and other such distortion, should bass response reduction fail to provide adequate compensation.

The present invention is therefore effective for reducing distortion and also for controlling switching transients. The invention is provided in a plurality of formats including a continuously controllable manually-operated version; a linear monolithic version, including using transconductance current control resistance; and a CMOS monolithic version, including a series of analog-to-digital control circuits for providing various programmed resistances in response to an input signal.

DETAILED DESCRIPTION OF PREFERRED AND ALTERNATE EMBODIMENTS

Figure 1:
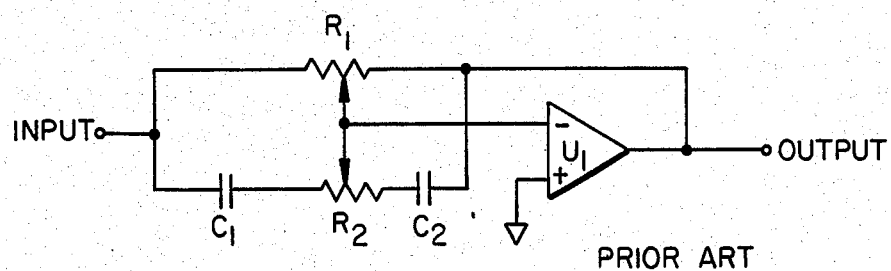
FIG. 1 is a schematic diagram of a prior art tone control circuit.
Figure 2:
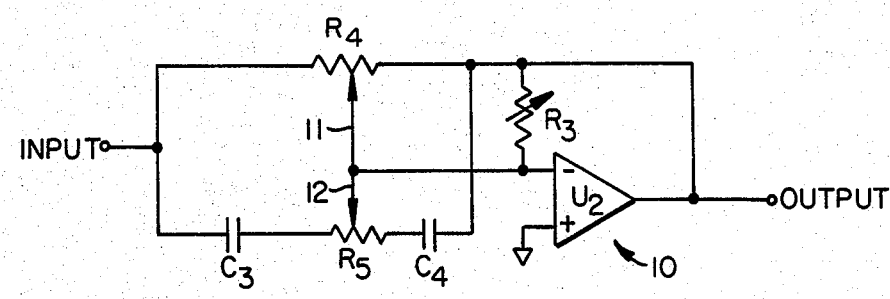
FIG. 2 is a schematic diagram of a tone control circuit including a variable resistor anti-distortion anti-transient control according to the present invention.

The basic embodiment of the present invention is shown in FIG. 2. A tone control circuit 10 comprising an amplifier U2 provides continuously adjustable tone characteristics as a function of the setting of potentiometers R4 and R5 and of capacitors C3 and C4. The basic embodiment of the invention also includes a variable resistor R3 coupled between the inverting or negative input and the output of amplifier U2. Variable resistor R3 may be a discrete component, such as a potentiometer or rheostat, or it may be an integrated component in an integrated circuit assembly, as discussed below.

When variable resistor R3 is at its maximum value, it acts as an open circuit and has no effect on the operation of the volume level and tone control circuit. As the resistance of variable resistor R3 is decreased, low frequency gain is first lowered because capacitors C3 and C4 act as open circuits and the circuit gain is therefore defined by high resistance potentiometer R4. As the resistance of variable resistor R3 is further reduced it gradually but ultimately short circuits whatever impedance exists between the inverting input and the output of amplifier 42, thereby lowering overall signal volume.

Figure 3:
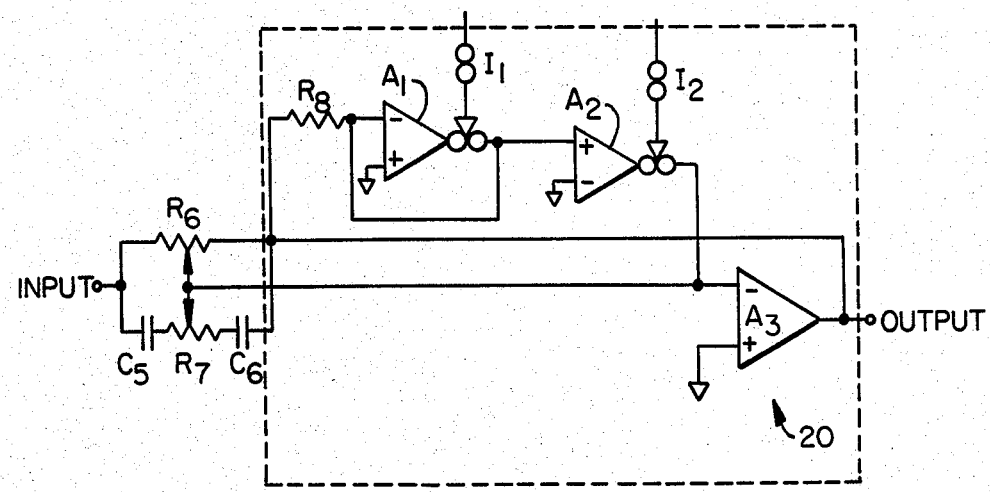
FIG. 3 is a schematic diagram of the present invention as it is embodied in a linear monolithic structure.

FIG. 3 shows an alternate embodiment of the present invention of the type that may be incorporated into a linear integrated circuit package to provide the anti-distortion anti-transient features of the present invention. A standard tone control input circuit consisting of potentiometers R6 and R7 and capacitors C5 and C6 is shown including an input for receiving an audio signal. The tone control circuit is coupled to the input of an amplifier A3 to provide a feedback path between the inverting input of amplifier A3 and the amplifier's output. The monolithic or integrated portions of the circuit are shown within dashed lines in FIG. 3 as circuit 20.

In operation, an output signal from amplifier A3 is fed back to the inverting input of the amplifier in accordance with the tone settings of variable resistors R6 and R7. First and second transconductance amplifiers A1 and A2 are coupled in series with a resistor R8, between the inverting input and the output of amplifier A3. The transconductance amplifiers form a variable resistance controlled by currents $I_1$ and $I_2$.

Variable resistance is provided in such a way that distortion is low and the signal-to-noise ratio is high. These properties of the current-driven variable resistance are the result of using the two transconductance amplifiers. Amplifier A1 acts as an attenuator and predistortion diode stage for the second transconductance amplifier. The resistance of the circuit comprising amplifiers A1 and A2 is decreased by decreasing bias current $I_1$ and by increasing the bias current $I_2$. The variable resistance-transconductance amplifier circuit includes the precondition diode stage to maintain low distortion by providing a constant amplitude input signal to second transconductance amplifier A2.

Current control signals $I_1$ and $I_2$ can be developed "on chip" from an external signal. Such a signal may be provided in any one of a number of well known ways. The generation of such signals is not considered to be a significant portion of the present invention. Rather, it is only necessary that the signals be provided to control the current sources of amplifiers A1 and A2 and to accordingly vary the resistance of the current-driven transconductance amplifier circuit.

Figure 4:
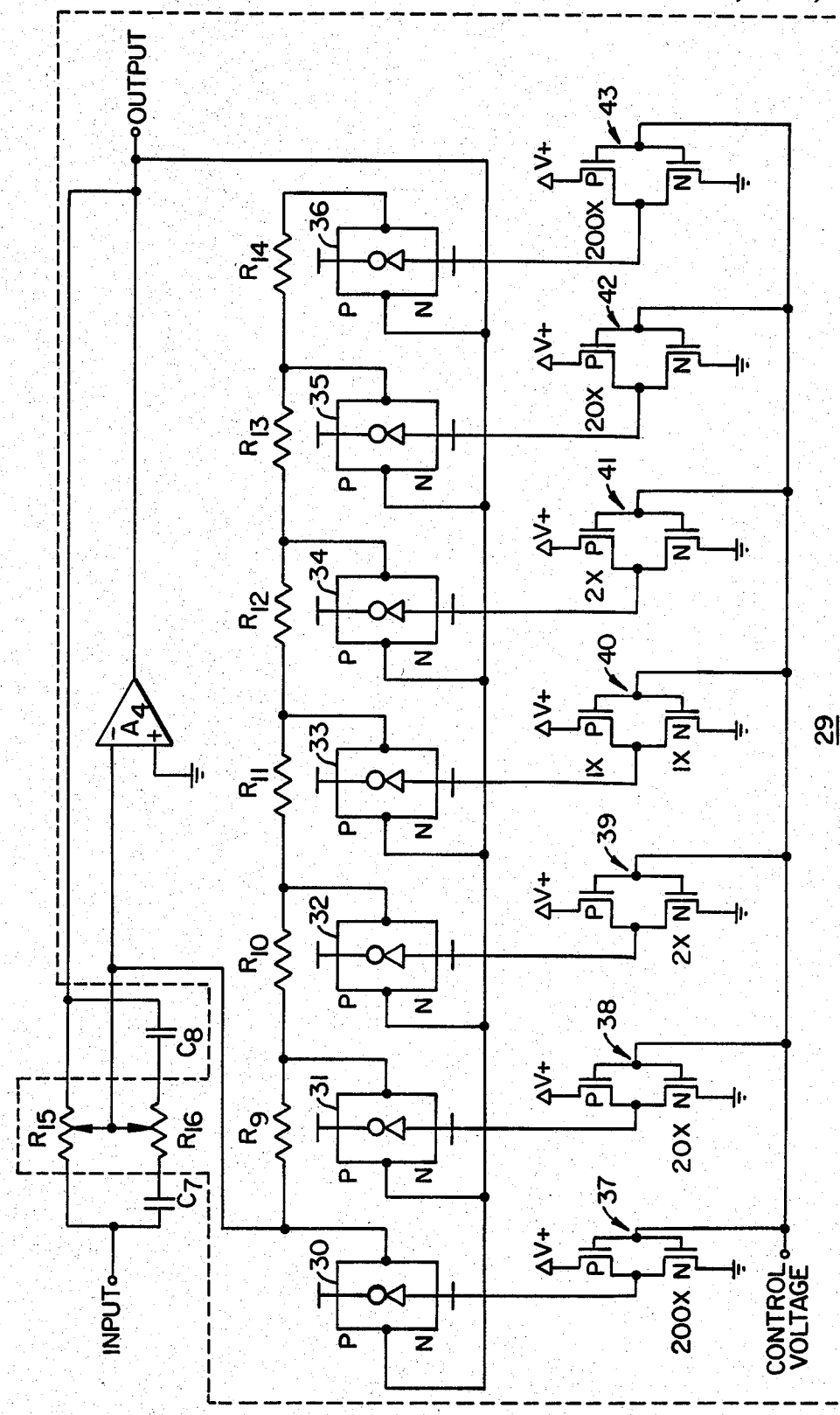
FIG. 4 is a schematic diagram of the present invention as embodied in a CMOS monolithic structure.

FIG. 4 shows another alternate embodiment of the invention which includes a standard tone control input stage. Potentiometers R15 and R16 and capacitors C7 and C8 provide tone control. The embodiment of FIG. 4 is typically produced in a CMOS monolithic format as shown within the dashed lines in FIG. 4 as circuit 29. It should be noted that potentiometers R15 and R16, although shown as integrated components of the monolithic structure, could also be provided as discrete components in other, equivalent embodiments of the invention.

The present invention is coupled between the output and the negative input of amplifier A4. The invention includes a series of discrete resistors R9-R14 which are coupled in parallel with corresponding transistor switches 30-36. The resistors and associated transistor switches are operable to selectively decrease the resistance of the feedback path between the output and the input of amplifier A4 in discrete steps and in response to a control voltage. In other embodiments of the invention the transistor switches could be operable to selectively increase the feedback path resistance, if desired.

Transistor switches 31-36, when active, provide a short circuit around corresponding resistors R9-R14. The "shorting" of resistors R9-R14 lowers the overall resistance of the feedback path. Operation of the circuit is similar to that of the embodiments discussed above in that providing a decreasing resistance in the feedback path initially reduces the low frequency components of the input signal to reduce bass response and prevent distortion due to excess low frequency energy. Resistors R9-R14, when so selected or bypassed, also decrease volume level as total resistance is further decreased. The control voltage may be generated from any number of sources, as discussed above.

The CMOS embodiment of the present invention is provided as described because it is not practical to build the transconductance amplifier stage in the embodiment of FIG. 3 (linear integrated circuit technology) using CMOS integrated circuit technology. In CMOS technology, different advantages are provided. One advantage of CMOS is the ability to build a good switch. It is for this reason that a series of discrete resistances and accompanying switches are provided in the CMOS embodiment of the invention.

Transistor switches 30-36 are controlled by corresponding transistor inverters 37-43. In CMOS technology, it is a simple matter to form transistor inverters such that a different inverter threshold voltage operates each of the several inverters. The threshold voltage value is a function of the ratio of the size of the N-channel transistor to the P-channel transistor used to form the inverters. Transistor inverters 37-43 provide a simple analog-to-digital converter using the threshold voltage response of each individual transistor inverter to detect discrete analog signal levels. The accuracy of the analog-to-digital conversion in the present invention is acceptable. That is, the conversion is a monotonic function and therefore satisfactory for the present application. It is considered a unique aspect of the present invention that analog-to-digital conversion is a function of the ratio of N-channel transistor size to P-channel transistor size.

In operation, the control voltage supplied to transistor inverters 37-43 is at a V+ (high) voltage level. As the control voltage is lowered, transistor inverters 37-43 corresponding to transistor switches 30-36 are progressively turned on in sequence, one after the other as the voltage continues to decrease. As a result, the low frequency (base) response and gain of amplifier A4 is controlled, as described above. The ratio of the size of the N-channel transistor to the size of the P-channel transistor in transistor inverters 37-43 is indicated in FIG. 4 by the placement of a value at the P or N end of the particular device. Thus, for transistor inverter 37, the ratio or the size of the N-channel transistor to that of the P-channel transistors is 200:1, for transistor switch 43, the ratio or the size of the P-channel transistor to that of the N-channel transistor is 200:1, and so on.

The foregoing detailed description is provided for purposes of illustration and example. Various equivalent embodiments of the invention may be made. For example, the circuit could readily be made in NMOS technology or other integrated circuit technologies; the control signal may be either a decreasing, increasing, or digital signal; separate control signals or suppression circuits may be included in a volume level and tone control circuit for both eliminating reproduced signal degradation due to excess signal level (clipping) and function or power switching induced transients. The scope of the invention should be limited only by the breadth of the claims.

I claim:

1. In a tone control circuit, including an amplifier having an adjustable frequency response control operable to vary the effect of low and high frequency filters upon said amplifier, a distortion and transient suppression circuit, comprising:

a programmable variable resistor, coupled between an inverting input and an output of said amplifier, to attenuate circuit low frequency response as resistor value is initially varied in response to a programming distortion/transient control signal and to thereafter reduce overall amplifier gain as resistor value is further varied in response to said programming distortion/transient control signal said programmable variable resistor comprising a programmable variable gain transconductance amplifying circuit wherein gain is a function of a variable control bias signal.

2. The circuit of claim 1, wherein said programmable variable resistor is a continuously variable resistor.

3. The circuit of claim 1, wherein said programmable variable resistor is a discretely variable resistor.

4. The circuit of claim 1, said programmable variable gain transconductance amplifying circuit further comprising:

a first transconductance amplifying circuit operable in response to a first variable bias control signal as an attenuation and precondition diode device; and a second transconductance amplifying circuit operable in response to a second variable bias control signal as an amplifying device, wherein said first and second bias control signals comprise said variable control bias signal.

5. The circuit of claim 4, wherein said circuit comprises a linear monolithic device.

6. In a tone control circuit, including an amplifier having a continuously adjustable frequency response control operable to vary the effect of low and high frequency filters upon said amplifier, a monolithic CMOS distortion and transient suppression circuit comprising:

a plurality of resistors, coupled in series between an inverting input and an output of said amplifier;

a transistor switch corresponding to each of said resistors and coupled in parallel with corresponding resistors to selectively bypass the resistors in response to an analog threshold signal consisting of a programming distortion/transient control signal;

whereby circuit low frequency response is initially varied in response to said programming distortion/transient control signal and whereby overall amplifier gain is thereafter reduced as resistor value is further varied in response to said programming distortion/transient control signal.

7. The circuit of claim 6 further comprising an analog-to-digital converter including a CMOS transistor inverter for each of said transistor switches for selectively bypassing a corresponding one of said series coupled resistors in response to said analog threshold signal as a function of the ratio of the size of an N-channel inverter transistor to the size of a P-channel inverter transistor.

8. In a tone control circuit, including an amplifier having a continuously adjustable frequency response control operable to vary the effect of low and high frequency filters upon said amplifier, a method for suppressing amplifier output distortion and transient interference, comprising:

varying the gain of a transconductance amplifying circuit coupled between an inverting input and an output of said amplifier in response to a programming distortion/transient control signal to attenuate circuit low frequency response as the gain of said transconductance amplifying circuit is initially varied in response to said programming distortion/transient control signal and to thereafter reduce overall amplifier gain as the gain of said transconductance amplifying circuit is further varied in response to said programming distortion/transient control signal.

9. The method of claim 8, further comprising the step of continuously varying said resistor.

10. The method of claim 8, further comprising the step of varying said resistor in discrete steps.

11. The method of claim 8, further comprising the steps of:

operating a first transconductance amplifying circuit in response to a first variable bias control signal as an attenuation and precondition diode device; and operating a second transconductance amplifying circuit in response to a second variable bias control signal as an amplifying device, wherein said first and second bias control signals comprise a programming/transient control bias signal.

12. In a tone control circuit, including an amplifier having a continuously adjustable frequency response control operable to vary the effect of low and high frequency filters upon said amplifier, a method for suppressing amplifier output distortion and transient interference comprising:

bypassing one or more of a plurality of resistors coupled in series between an inverting input and an output of said amplifier to accordingly provide increased or decreased resistance between said amplifier output and said inverting input in response to a programming distortion/transient control signal; and operating a transistor switch corresponding to each of said resistors in said plurality and coupled in parallel therewith to selectively bypass the resistors in response to an analog threshold signal consisting of said programming distortion/transient control signal.

* * * * *